(12) United States Patent
Li

(10) Patent No.: US 10,199,383 B2
(45) Date of Patent: Feb. 5, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/808,781

(22) Filed: Nov. 9, 2017

(65) Prior Publication Data

US 2018/0151575 A1    May 31, 2018

(30) Foreign Application Priority Data

Nov. 28, 2016 (CN) .......................... 2016 1 1067425

(51) Int. Cl.
*H01L 21/8238* (2006.01)
*H01L 27/11* (2006.01)
(Continued)

(52) U.S. Cl.
CPC .... *H01L 27/1116* (2013.01); *H01L 21/28079* (2013.01); *H01L 21/28088* (2013.01);
(Continued)

(58) Field of Classification Search
CPC .......... H01L 21/1116; H01L 21/28185; H01L 21/32139; H01L 21/32136; H01L 29/517;
(Continued)

(56) References Cited

U.S. PATENT DOCUMENTS 9,502,416 B1    11/2016 Kim
2014/0363960 A1    12/2014 Kim et al.
(Continued)

OTHER PUBLICATIONS

The European Patent Office (EPO) The Extended European Search Report for 17202703.9 dated Apr. 26, 2018 6 Pages.

*Primary Examiner* — Savitr Mulpuri
(74) *Attorney, Agent, or Firm* — Anova Law Group, PLLC

(57) ABSTRACT

Semiconductor structures and fabrication methods thereof are provided. An exemplary fabrication method includes providing a base substrate having an N-type logic region including a first and a second N-type threshold voltage region, a P-type logic region including a first and a second P-type threshold voltage region, a pull-up transistor region and an adjacent pull-down transistor region; forming a gate dielectric layer; forming a first work function layer on the gate dielectric layer; removing portions of the first work function layer; forming a second work function layer on remaining first work function layer and exposed portions of the gate dielectric layer; removing a portion of the second work function layer; forming an N-type work function layer on remaining second work function layer and exposed portion of the gate dielectric layer in the second N-type threshold voltage region; and forming a gate electrode layer on the N-type work function layer.

9 Claims, 5 Drawing Sheets

(51) Int. Cl.
*H01L 29/49* (2006.01)
*H01L 21/28* (2006.01)
*H01L 29/51* (2006.01)
*H01L 29/66* (2006.01)
*H01L 29/78* (2006.01)
H01L 29/423 (2006.01)
H01L 27/092 (2006.01)

(52) U.S. Cl.
CPC ............... *H01L 21/82385* (2013.01); *H01L 21/823821* (2013.01); *H01L 21/823842* (2013.01); *H01L 27/1104* (2013.01); *H01L 29/4958* (2013.01); *H01L 29/517* (2013.01); *H01L 29/66545* (2013.01); *H01L 29/785* (2013.01); *H01L 27/0922* (2013.01); *H01L 27/0924* (2013.01); *H01L 29/42372* (2013.01); *H01L 29/4966* (2013.01)

(58) Field of Classification Search
CPC ......... H01L 29/42364; H01L 29/66545; H01L 27/0922; H01L 27/108; H01L 27/1104; H01L 21/82345; H01L 21/823842; H01L 21/28088; H01L 21/28176; H01L 29/4966; H01L 29/513; H01L 29/518; H01L 21/823821; H01L 21/31133; H01L 21/02041
See application file for complete search history.

(56) References Cited

U.S. PATENT DOCUMENTS

| | | |
|---|---|---|
| 2016/0336194 A1 | 11/2016 | Yeh et al. |
| 2017/0194334 A1* | 7/2017 | Wu .................. H01L 21/28282 |
| 2018/0151451 A1* | 5/2018 | Li .................... H01L 21/28088 |
| 2018/0151573 A1* | 5/2018 | Li .................... H01L 21/28079 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201611067425.X, filed on Nov. 28, 2016, the entirety of which is incorporated herein by reference.

FIELD OF THE DISCLOSURE

The present disclosure generally relates to the field of semiconductor technologies and, more particularly, relates to semiconductor structures and fabrication methods thereof.

BACKGROUND

In semiconductor industry, integrated circuit (IC) products can be categorized into three types: logic circuits, memory and analog circuits. The memory devices account for a relative large portion in the IC products. With the continuous development of semiconductor technologies, to broaden the applications of the memory devices, there is a need to form the memory devices and other devices in a same chip simultaneously so as to form an embedded semiconductor memory apparatus. For example, if the memory devices are embedded into a central processing unit (CPU), the memory devices need to be compatible with the CPU platform having the embedded memory devices; and the size and the corresponding electrical properties of the memory devices are retained.

Usually, the memory devices need to be compatible with the embedded logic apparatus. An embedded semiconductor device often have a logic region and a memory region. The logic region includes logic devices; and the memory region includes memory devices. With the continuous development of the memory technologies, a few types of semiconductor memory devices have been developed, such as static random access memory (SRAM), dynamic random access memory (DRAM), erasable programmable read-only memory (EPROM), electrically erasable programmable read-only memory (EEPROM) and Flash memory. Because SRAM has the characteristics including low power-consumption and high working speed, SRAM and its fabrication methods have attracted more and more attentions.

However, it is desirable to enhance the performance of the SRAM in the semiconductor device so as to improve the overall performance of the semiconductor device. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a base substrate having an N-type logic region including a first N-type threshold voltage region and a second N-type threshold voltage region, a P-type logic region including a first P-type threshold voltage region and a second P-type threshold voltage region, a pull-up transistor region and a pull-down transistor region adjacent to the pull-up transistor region; forming a gate dielectric layer on portions of the base substrate in the N-type logic region, the P-type logic region, the pull-up transistor region and the pull-down transistor region; forming a first work function layer on the gate dielectric layer; removing portions of the first work function layer in the N-type logic region, the pull-up transistor region and the second P-type threshold voltage region; forming a second work function layer on remaining first work function layer and exposed portions of the gate dielectric layer; removing a portion of the second work function layer in the second N-type threshold voltage region; forming an N-type work function layer on remaining second work function layer and exposed portions of the gate dielectric layer in the second N-type threshold voltage region; and forming a gate electrode layer on the N-type work function layer.

Another aspect of the present disclosure includes a semiconductor structure. The semiconductor structure includes a base substrate, having an N-type logic region including a first N-type threshold voltage region and a second N-type threshold voltage region, a P-type logic region including a first P-type threshold voltage region and a second P-type threshold voltage region, a pull-up transistor region and a pull-down transistor region adjacent to the pull-up transistor region; a gate dielectric layer on portions of the base substrate in the N-type logic region, the P-type logic region, the pull-up transistor region and the pull-down transistor region; a first work function layer on portions of the gate dielectric layer in the first P-type threshold voltage and the pull-up transistor region; a second work function layer on a portion of the gate dielectric layer in the first N-type threshold voltage region, a portion of the gate dielectric layer in the second P-type threshold voltage region, a portion of the gate dielectric layer in the pull-down transistor region and portions of the first work function layer in the first P-type threshold voltage region and the pull-up transistor region; an N-type work function layer on the second work function layer and a portion of the gate dielectric layer in the second N-type threshold voltage region; and a gate electrode layer on the N-type work function layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
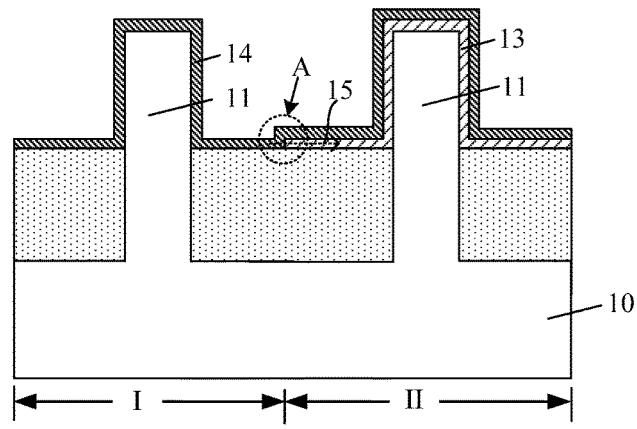
FIG. 1 illustrates a structure corresponding to certain stages of a fabrication process of a semiconductor structure.

FIG. 1 illustrates a structure corresponding to certain stages of a fabrication process of a semiconductor structure.

As shown in FIG. 1, the fabrication process includes providing a base substrate. The base substrate includes a semiconductor substrate 10 and a plurality of discrete fins 11 on the semiconductor substrate 10. The semiconductor substrate 10 includes a pull-down transistor region I used for forming a pull-down transistor, and a pull-up transistor region II used for forming a pull-up transistor. The method also includes forming a P-type work function layer 13 across the fins 11 in the pull-down transistor region I and the pull-up transistor region II. The P-type work function layer 13 also covers the side and top surfaces of the fins 11. Further, the method includes removing the P-type work function layer 13 in the pull-down transistor region I; and forming an N-type work function layer 14 across the fins 11 in the pull-down transistor region I. The N-type work function layer 14 also covers the side and top surfaces of the fins 11 in the pull-down transistor region I; and the N-type work function layer 14 also covers the P-type work function layer 13 in the pull-up transistor region II.

In the process for forming the N-type work function layer 14, the N-type work function layer 14 covers the side surface of the P-type work function layer 13 (as shown in region "A" in FIG. 1). Thus, the metal ions in the N-type work function layer 14 may be easy to laterally diffuse into the P-type work function layer 13 through the side surface of the P-type work function layer 13 along a direction parallel to the semiconductor substrate 10 directly. The diffusion path is illustrated as the dashed arrow in FIG. 1. The properties of the P-type work function layer 13 is adversely affected. The diffusion path is relatively short. Thus, the properties of the P-type work function layer 13 adjacent to the channel region of the pull-up transistor region II is significantly affected by the metal ions. The electrical properties of the pull-up transistor are mainly affected by the P-type work function layer 13 adjacent to the channel region. Accordingly, the electrical properties of the SRAM may be easily deteriorated; and the overall performance of the semiconductor device is undesired. Further, the diffusion abilities of metal ions from different devices are different. Thus, a severe mismatch issue between the pull-down transistor and the pull-up transistor in the SRAM may easily occur.

In the present disclosure, after forming a second work function layer on the remaining first work function layer and the exposed gate dielectric layer, the second work function layer in the pull-down transistor region may be retained. Thus, during the subsequent process for forming an N-type work function layer, the N-type work function layer is formed on the second work function layer in the pull-down transistor region. Comparing with that only N-type work function layer is formed in the pull-up transistor region, the second work function layer in the present disclosure may cover the side surface of the first work function layer at the boundary region between the pull-up transistor region and the pull-down transistor region; and may also cover the top surface of the first work function layer in the pull-up transistor region. The second work function layer may increase the diffusion path of the ions in the subsequently formed N-type work function layer to the first work function layer in the pull-up transistor. Thus, the diffusion scale of the metal ions may be gradually decreased.

Accordingly, the effect of the metal ions on the properties of the first work function layer in the pull-up transistor region is reduced. Further, the second work function layer at the boundary region between the pull-down transistor region and the pull-up transistor region may not be affected by etching processes, etc., and the quality of the second work function layer may be improved as desired. Because the electrical properties of the device in the pull-up transistor region are mainly affected by the first work function layer adjacent to the channel region, on one hand, the adverse effect on electrical properties of the device in the pull-up transistor region may be avoided. On the other hand, the mismatch of the diffusion scales of the metal ions in different devices may be avoided. Thus, the mismatch issue between the pull-up transistor and the pull-down transistor in the SRAM may be substantially solved. Accordingly, the electrical properties of the SRAM may be controlled; and the overall performance of the semiconductor device may be enhanced.

Figure 12:
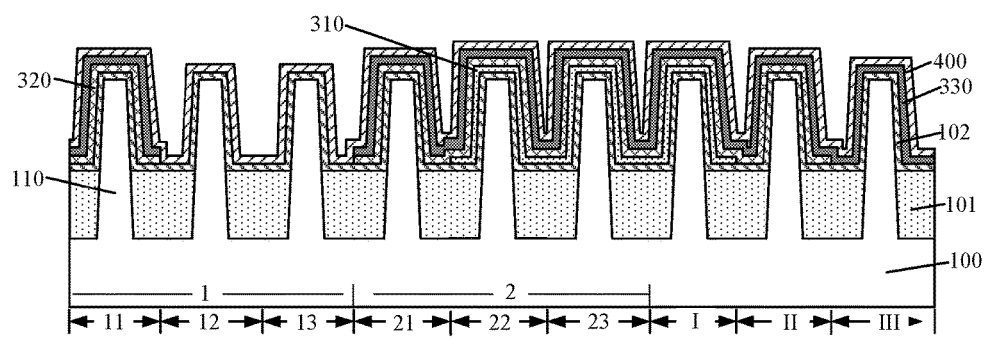
Figure 13:
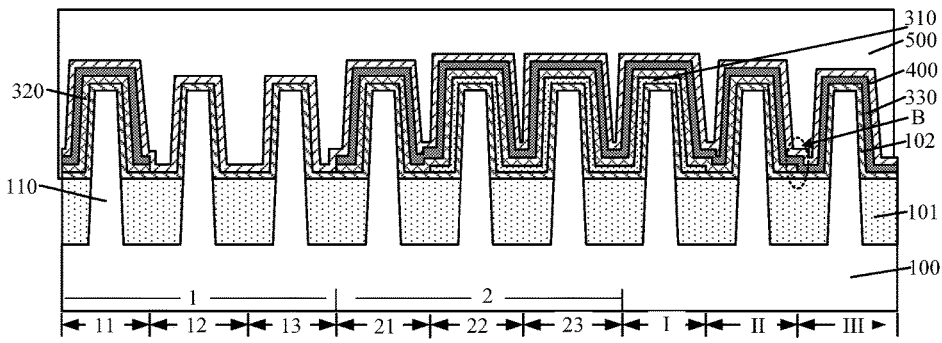
Figure 14:
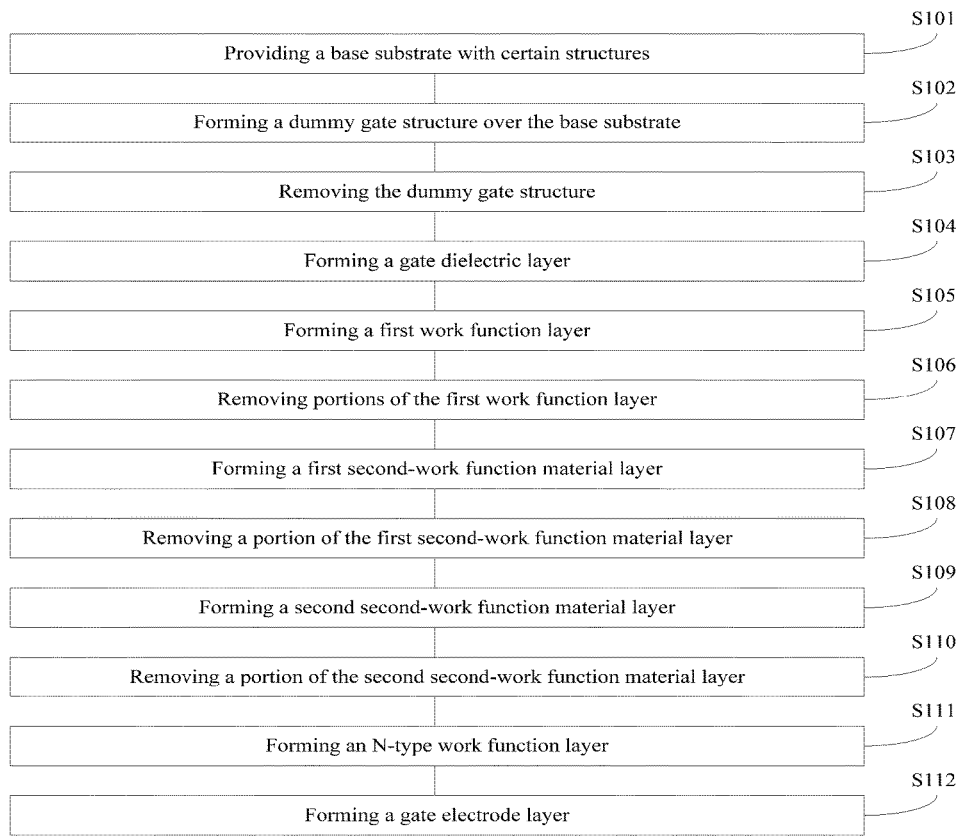
FIG. 14 illustrates an exemplary fabrication process of a semiconductor structure consistent with the disclosed embodiments.

FIG. 14 illustrates an exemplary fabrication process of a semiconductor structure consistent with the disclosed embodiments. FIGS. 2-13 illustrate structures corresponding to certain stages of the exemplary fabrication process.

Figure 2:
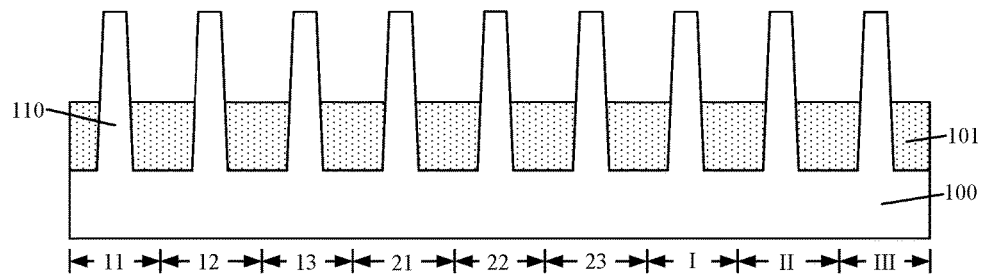
FIGS. 2-13 illustrate structures corresponding to certain stages of an exemplary fabrication process of a semiconductor structure consistent with the disclosed embodiments.
Figure 3:
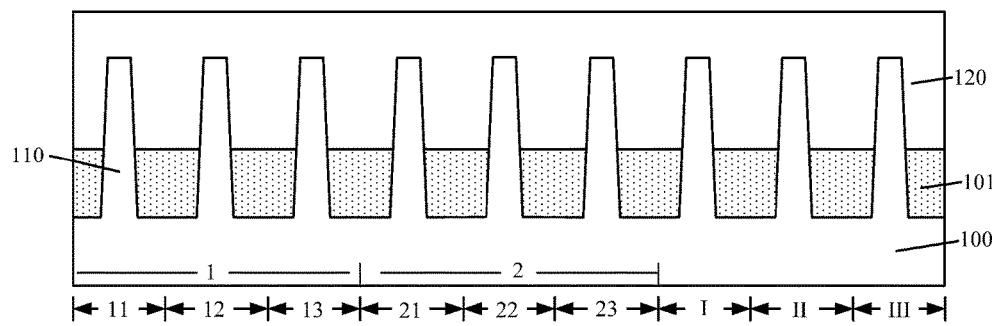

As shown in FIG. 14, at the beginning of the fabrication process, a base substrate is provided (S101). FIG. 2 illustrates a corresponding semiconductor structure.

As shown in FIG. 2, a base substrate is provided. The base substrate may include an N-type logic region 1, a P-type logic region 2, and a pull-up transistor region I and an adjacent pull-down transistor region II. The N-type logic region 1 may include a first N-type threshold voltage region 11 used for forming a first N-type device, and a second N-type threshold voltage region (not shown) used for forming a second N-type device. The threshold voltage of the first N-type device may be greater than the threshold voltage of the second N-type device. The P-type logic region 2 may include a P-type threshold voltage region (not shown) used for forming a first P-type device, and a second P-type threshold voltage region 21 used for forming a second P-type device. The threshold voltage of the first P-type device may be smaller than the threshold voltage of the second P-type device.

In one embodiment, the semiconductor structure includes logic devices and SRAM devices. Thus, the N-type logic region 1 may provide a process platform for subsequently forming N-type logic devices; the P-type logic region 2 may provide a process platform for subsequently forming P-type logic devices; the pull-up transistor region I may provide a process platform for subsequently forming a pull-up transistor; and the pull-down transistor region II may provide a process platform for subsequently forming a pull-down transistor. The pull-up transistor region I may be a PMOS region; and the pull-down transistor region II may be an NMOS region.

In one embodiment, the base substrate may also include a transfer gate transistor region III. The transfer gate transistor region III may provide a process platform for subsequent forming a transfer gate transistor. The transfer gate transistor region III may be an NMOS region. The pull-up transistor region I, the pull-down transistor region II and the transfer gate transistor region III may be memory regions. The memory regions may provide a process platform for subsequently forming a static random access memory (SRAM).

The N-type logic region 1 may include a plurality of N-type threshold voltage regions. Specifically, the first N-type threshold voltage region 11 may be an N-type standard threshold voltage region (SVT or standard VT) 11; the second N-type threshold voltage region may include an N-type ultralow threshold voltage region (ULVT or ultralow VT) 13, and an N-type low threshold voltage region (LVT or low VT) 12.

The threshold voltages of the N-type logic devices formed in the N-type logic region can be sorted from low to high for the threshold voltage of the N-type ULVT region 13, the threshold voltage of the N-type LVT region 12 and the threshold voltage of the first N-type SVT region 11. The N-type logic region may also include an N-type high threshold voltage (HVT, High VT) region (not shown) and an N-type input/output (TO) device region (not shown).

The P-type logic region 2 may include a plurality of P-type threshold regions. Specifically, the first P-type threshold voltage region may include a P-type ultralow threshold voltage region 23, and a P-type low threshold voltage region 22. The second P-type threshold voltage region 21 may be a P-type standard threshold voltage region 21.

The threshold voltages of the P-type logic devices formed in the P-type logic region 2 may be sorted from low to high for the threshold voltage of the P-type ultralow threshold voltage region 23, the threshold voltage of the P-type low threshold voltage region 22, and the threshold voltage of the second P-type standard threshold voltage region 21. The P-type logic region 2 may also include a P-type logic high threshold voltage region (not shown) and a P-type input/output (TO) device region (not shown).

In one embodiment, the semiconductor structure is a fin field-effect transistor (FinFET) structure. The base substrate may include a semiconductor substrate 100 and a plurality of fins 110 on the semiconductor substrate 100.

In some embodiments, the semiconductor structure may be planar transistors. Correspondingly, the base substrate may be a planar substrate. The planar substrate may be a silicon substrate, a germanium substrate, a silicon germanium substrate, a silicon carbide substrate, a silicon on insulator (SOI) substrate, a germanium on insulator (GOI) substrate, a glass substrate, or a Group III-V compound substrate (such as gallium nitride substrate, or gallium arsenide substrate, etc.), etc.

In one embodiment, the semiconductor substrate 100 is a silicon substrate. In some embodiments, the semiconductor substrate may be made of germanium, silicon germanium, silicon carbide, gallium arsenide, gallium indium, etc. The semiconductor substrate may also be a silicon on insulator (SOI) substrate, a germanium on insulator (GOI) substrate, a glass substrate, or a Group III-V compound substrate (such as gallium nitride substrate, or gallium arsenide substrate, etc.), etc.

In one embodiment, the fins 110 and the semiconductor substrate 100 are made of a same material. The fins 110 and the semiconductor substrate 100 are made of silicon. In some embodiments, the fins may also be made of germanium, silicon germanium, silicon carbide, gallium arsenide, or gallium indium, etc.

The process for forming the semiconductor substrate 100 and the fins 110 may include providing an initial substrate; forming a patterned hard mask layer on the surface of the initial substrate (not shown); and etching the initial substrate using the patterned hard mask layer as an etching mask. Thus, the semiconductor substrate 100 and the fins 110 protruding from the semiconductor substrate 100 may be formed.

In one embodiment, after forming the semiconductor substrate 100 and the fins 110, the hard mask layer may be retained. The hard mask layer may be made of silicon nitride. During the subsequent planarization process, the top surface of the hard mask layer may be used as a stop layer of the planarization process. The hard mask layer may also function to protect the tops of the fins 110.

Further, as shown in FIG. 2, after forming the semiconductor substrate 100 and the fins 110, an isolation structure 101 may be formed on the surface of the semiconductor substrate 100 exposed by the fins 110. The isolation structure 101 may cover the side surfaces of the fins 110; and the top surface of the isolation structure 101 may be below the tops of the fins 110.

The isolation structure 101 may be used as the isolation structure of the semiconductor structure; and used to isolate adjacent devices. In one embodiment, the isolation structure 101 is made of silicon oxide. In some embodiments, the isolation structure may be made of silicon nitride, or silicon oxynitride, etc.

The process for forming the isolation structure 101 may include forming an isolation material layer (not labeled) on the semiconductor substrate 100 exposed by the fins 110 and on the patterned hard mask layer; removing the portion of the isolation material layer above hard mask layer by a polishing process to form an isolation film; etching-back a partial thickness of the isolation film to expose the top surface of the fins 110 and top portions of the fins 110 to form the isolation structure 101; and removing the patterned hard mask layer.

N-type well regions (not shown) may be formed in the base substrate in P-type logic region 2 and the pull-up transistor region I by performing an N-type well region doping process on the P-type logic region 2 and the pull-up transistor region I. P-type well regions (not shown) may be formed in the base substrate in the N-type logic region 1, the pull-down transistor region II and the transfer gate transistor region III by performing a P-type well doping region doping process on the base substrate in the N-type logic region 1, the pull-down transistor region II and the transfer gate transistor region III.

Further, a work function layer corresponding to the N-type ultra-low threshold voltage region 13 and a work function layer corresponding to the N-type low threshold voltage region 12 may be subsequently formed in a same step; and the threshold voltage of the device in the N-type ultra-low threshold voltage region 13 may be smaller than the threshold voltage of the device in the N-type low threshold voltage region 12. Thus, after forming the isolation film and before removing the partial thickness of the isolation film, a first N-type threshold voltage adjusting doping process (VT Implant) may be performed on the portion of the base substrate corresponding to the N-type ultra-low threshold voltage region 13; and a second N-type threshold voltage adjusting doping process may be performed on the portion of the base substrate corresponding to the N-type low threshold voltage region 12. The ions used in the first N-type threshold voltage adjusting doping process and the second N-type threshold voltage adjusting doping process may be N-type ions. The N-type ions may include P ions, As ions, or Sb ions, etc. The doping concentration of the first threshold voltage adjusting doping process may be smaller than the doping concentration of the second threshold voltage adjusting doping process.

Further, a work function layer corresponding to the P-type ultra-low threshold voltage region 23 and a work function layer corresponding to the P-type low threshold voltage region 22 may be subsequently formed by a same step; and the threshold voltage of the device in the P-type ultra-low threshold voltage region 23 may be smaller than the threshold voltage of the device in the P-type low threshold voltage region 22. Thus, after forming the isolation film and before removing the partial thickness of the isolation film, a first P-type threshold voltage adjusting doping process (VT Implant) may be performed on the portion of the base substrate corresponding to the P-type ultra-low threshold voltage region 23; and a second P-type threshold voltage adjusting doping process may be performed on the portion of the base substrate corresponding to the P-type low threshold voltage region 22. The ions used in the first P-type threshold voltage adjusting doping process and the second P-type threshold voltage adjusting doping process may be P-type ions. The P-type ions may include B ions, Ga ions, or In ions, etc. The doping concentration of the first P-type threshold voltage adjusting doping process may be smaller than the doping concentration of the second P-type threshold voltage adjusting doping process.

Figure 4:
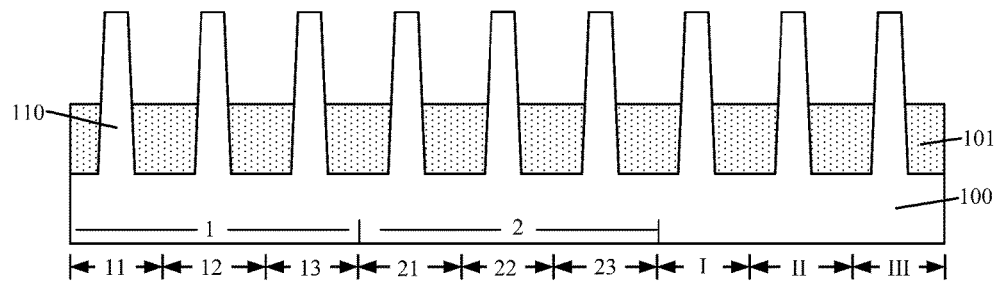

Returning to FIG. 14, after providing the base substrate, a dummy gate structure may be formed (S102). FIG. 4 illustrates a corresponding semiconductor structure.

The dummy gate structure may be formed by any appropriate process. In one embodiment, a high K-last gate-last process is used to form the gate structure of the semiconductor structure. Thus, as shown in FIG. 14, after forming the isolation structure 101, a dummy gate structure 120 is formed on the surface of the base substrate in the N-type logic region 1, the P-type logic region 2, the pull-up transistor region I, the pull-down transistor region II and the transfer gate transistor region III. The dummy gate structure 120 may provide a spatial position for subsequently forming the gate structure of the semiconductor structure. The dummy gate structure 120 may be across the fins 110 by covering the side and top surfaces of the fins 110.

In one embodiment, the dummy gate structure 120 may be across the N-type logic region 1, the P-type logic region 2, the pull-up transistor region I, the pull-down transistor region II and the transfer gate transistor region III. In some embodiments, the gate structures in different regions may be independent.

The dummy gate structure 120 may be a single layer structure, or a multiple-layer stacked structure. In one embodiment, the dummy gate structure may include a dummy gate layer. In some embodiments, the dummy gate structure 120 may include a dummy oxide layer and a dummy gate layer on the dummy oxide layer. The dummy gate layer may be made of polysilicon, silicon oxide, silicon nitride, silicon oxynitride, silicon carbide, silicon carbonitride, silicon oxycarbon nitride, or amorphous carbon, etc. The dummy oxide layer may be made of silicon oxide, or silicon oxynitride, etc.

After forming the dummy gate structure 120, doped source/drain regions (not shown) may be formed in the fins 110 at two sides of the dummy gate structure 120. Specifically, the doped source/drain regions may be formed in the fins 110 at two sides of the dummy gate structure in each of the regions of the base substrate.

Then, an interlayer dielectric layer (not shown) may be formed on the based substrate exposed by the dummy gate structure 120. The interlayer dielectric layer may cover the side surfaces of the dummy gate structure 120; and expose the top surface of the dummy gate structure 120.

Returning to FIG. 14, after forming the dummy gate structure and the doped source/drain regions, the dummy gate structure may be removed (S103). FIG. 4 illustrates a corresponding semiconductor structure.

As shown in FIG. 4, the dummy gate structure 120 (referring to FIG. 3) is removed; and an opening (not labeled) may be formed in the interlayer dielectric layer at the position of the dummy gate structure 120.

The dummy gate structure 120 may be removed by any appropriate process, such as a dry etching process, a wet etching process, or a SiCoNi system etching process, etc.

Figure 5:
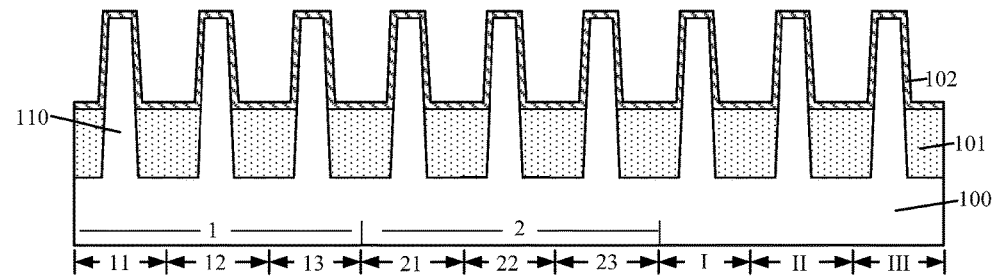

Returning to FIG. 14, after removing the dummy gate structure, a gate dielectric layer may be formed (S104). FIG. 5 illustrates a corresponding semiconductor structure.

As shown in FIG. 5, a gate dielectric layer 102 is formed on portions of the base substrate in the N-type logic region 1, the P-type logic region 2, the pull-up transistor region I and the pull-down transistor region II.

In one embodiment, the base substrate may include the transfer gate transistor region III. Thus, during the process for forming the gate dielectric layer 102, the gate dielectric layer 102 may also be formed on the portion of the base substrate in the transfer gate transistor region III.

In one embodiment, the gate dielectric layer 102 may include an interface layer (IL, not labeled) and a high-K gate dielectric layer (not labeled). The gate dielectric layer 102 may be across the fins 110 by covering portions of the side and top surfaces of the fins 110.

The interface layer may provide a desired interface base for forming the high-K gate dielectric layer. Thus, the quality of the high-K gate dielectric layer may be improved; and interfacial density between the high-K gate dielectric layer and the fins 110 may be reduced; and the adverse effect caused by the direct contact between the high-K dielectric layer and the fins 110 may be avoided. The interface layer may be made of silicon oxide, or silicon oxynitride, etc.

The interface layer may be formed by any appropriate process. In one embodiment, the interface layer is formed by an oxidation process. The interface layer may only be on the exposed portions of the side and top surfaces of the fins 110. In some embodiments, the interface layer may be formed by a deposition process, such as a chemical vapor deposition (CVD) process, a physical vapor deposition (PVD) process, or an atomic layer deposition (ALD) process, etc. The interface layer may also be formed on the isolation structure.

The high-K gate dielectric material may refer to the material having a relative dielectric constant greater than that of silicon oxide. In one embodiment, the high-K dielectric layer is $HfO_2$. In some embodiments, the high-K gate dielectric material may be HfSiO, HfSiON, HfTaO, HfTiO, HfZrO, $ZrO_2$ and $Al_2O_3$, etc.

Various processes may be used to form the high-K gate dielectric layer, such as a CVD process, a PVD process, or an ALD process, etc. In one embodiment, the high-K gate dielectric layer is formed by an ALD process. The high-K gate dielectric layer formed by the ALD process may have a desired step-coverage.

After forming the gate dielectric layer 102, a thermal annealing process (not shown) may be performed on the base substrate. The thermal annealing process may be able to repair the defects in the gate dielectric layer 102. Accordingly, the compactness of the gate dielectric layer 102 may be improved.

In one embodiment, the thermal annealing process may be a spike thermal annealing process, or a laser thermal annealing process. To achieve the purpose for increasing the compactness of the gate dielectric layer 102 and avoiding the adverse effect on the distribution of the doping ions inside the base substrate, the parameters of the thermal annealing process may need to be controlled in an appropriate range.

In one embodiment, the annealing temperature of the spike thermal annealing process may be in a range of approximately 850° C.-900° C.; and the pressure of the spike thermal annealing process may be the standard atmospheric pressure. The annealing temperature of the laser thermal annealing process may be in a range of approximately 900° C.-1000° C.; and the pressure of the laser thermal annealing process may be the standard atmospheric pressure.

In some embodiments, the thermal annealing process may include the spike thermal annealing process, followed by the laser thermal annealing process. By sequentially performing the relative low temperature spike thermal annealing process and the relatively high temperature laser thermal annealing process, the passivation of the ions may be avoided.

Figure 6:
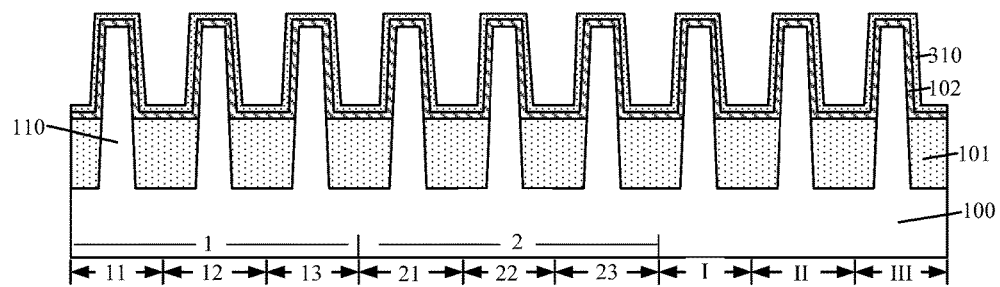

Returning to FIG. 14, after forming the gate dielectric layer, a first work function layer may be formed (S105). FIG. 6 illustrates a corresponding semiconductor structure.

As show in FIG. 6, a first work function layer 310 is formed on the portions of the gate dielectric layer 102 in the N-type logic region 1, the P-type logic region 2, the pull-up transistor region I and the pull-down transistor region II. The base substrate may also include the transfer gate transistor regions III. Thus, during the process for forming the first work function layer 310, the first work function layer 310 may also be formed on the portion of the gate dielectric layer 102 in the transfer gate transistor region III.

The first work function layer 310 may be used as portions of the work function layers corresponding to subsequently formed first P-type device and pull-up transistor; and may be used to adjust the work functions of the transistors corresponding to the first P-type device and the pull-up transistor. Thus, only the portions of the first work function layer 310 in the P-type ultralow work function voltage region 23, the P-type low work function region 22 and the pull-up transistor region I may be retained during the subsequent process.

The first work function layer 310 may be made of a P-type work function material. The work function of the P-type work function material may be in a range of approximately 5.1 eV-5.5 eV, such as 5.2 eV, 5.3 eV, or 5.4 eV, etc. The first work function layer 310 may be made of one or more of Ta, TiN, TaN, TaSiN, and TiSiN, etc.

Various processes may be used to form the first work function layer 310, such as a CVD process, a PVD process, or and ALD process, etc. In one embodiment, the first work function layer 310 is made of TiN; and is formed by an ALD process. The first work function layer 310 formed by the ALD process may have a desired step-coverage.

The thickness of the first work function layer 310 may be determined by the threshold voltages of the first P-type device and the pull-up transistor. In one embodiment, the thickness of the first work function layer 310 may be in a range of approximately 15 Å-35 Å.

Figure 7:
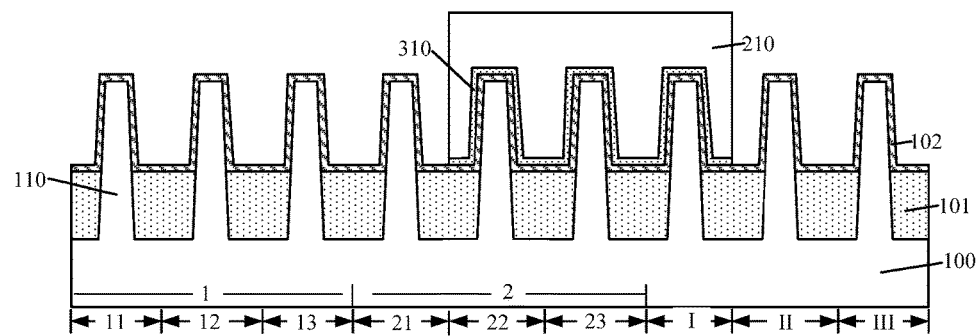

Returning to FIG. 14, after forming the first work function layer 310, portions of the first work function layer 310 may be removed (S106). FIG. 7 illustrates a corresponding semiconductor structure.

As shown in FIG. 7, the portions of the first work function layer 310 in the N-type logic region 1, the pull-down transistor region II and the second P-type threshold voltage region 21 are removed. By removing the portions of the first work function layer 310 in the N-type logic region 2, the pull-down transistor region II and the second P-type threshold voltage region 21, a process base may be provided for subsequently forming a relatively thin work function layer over the first work function layer 310 in the N-type logic region 1, the pull-down transistor region II and the second P-type threshold voltage region 21.

In one embodiment, according to specific process requirements, the portion of the first work function layer 310 in the transfer gate transistor region III may also be removed. Accordingly, a process base/platform may be provided for subsequently forming the relatively thin work function layer over the transfer gate transistor region III.

Specifically, the process for removing the first work function layer 310 may include forming a first pattern layer 210 on the first work function layer 310 in the N-type logic region 1, the pull-down transistor region II and the second P-type threshold voltage region 21; removing the portions of the first work function layer 310 in the N-type logic region 1, the pull-down transistor region II and the second P-type threshold voltage region 21 by a first etching process using the first pattern layer 210 as a mask to expose the gate dielectric layer 102; and removing the first pattern layer 210.

In one embodiment, the first pattern layer 210 may be made of photoresist. After the etching process, the first pattern layer 210 may be removed by a wet etching process, or a plasma ashing process.

In one embodiment, the first etching process may be a wet etching process so as to reduce the consumption of the gate dielectric layer 210 caused by the first etching process. In one embodiment, the first work function layer 310 is made of TiN. Thus, the etching solution of the first etching process may be a mixture solution of $NH_4OH$, $H_2O_2$ and water (i.e., SC1 solution), or a mixture solution of $NH_3$, $H_2O_2$ and water, or a mixture solution of HCl, $H_2O_2$ and water (i.e., SC2 solution). In some embodiments, the first etching process may be a dry etching process, or a combination of a dry etching process and a wet etching process.

Referring to FIGS. 8-11, after forming the first work function layer 310, a second work function layer (not labeled) may be formed on the remaining first work function layer 310 and the exposed gate dielectric layer 102; and the portion of the second work function layer in the second N-type threshold voltage region (not labeled) may be removed.

The second work function layer may be portions of the work function layers corresponding to the P-type logic region 2, the pull-up transistor region I, the first N-type threshold voltage region 11 and the pull-down transistor region II; and may be used to adjust the threshold voltages of the subsequently formed first P-type device, second P-type device, pull-up transistor, first N-type device and pull-down transistor. Thus, the portions of the second work function layer in the P-type logic region 2, the pull-up transistor region I, the first N-type threshold voltage region 11 and the pull-down transistor region II may be retained in the subsequent processes.

In one embodiment, the second work function layer is a stacked structure. The fabrication process of the second work function layer and the process for removing the portion of the second work function layer in the N-type threshold voltage region are described as following.

Figure 8:
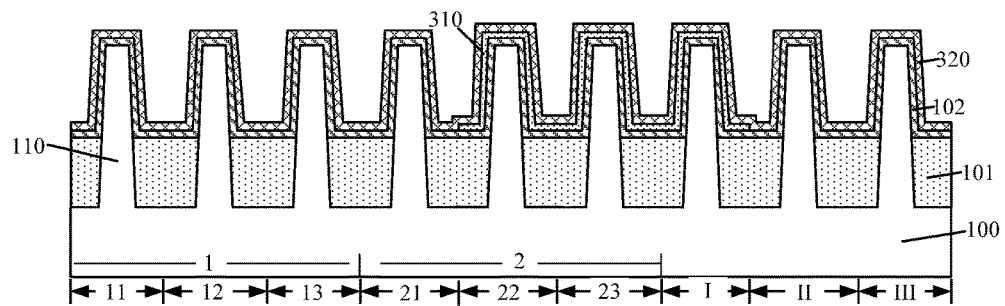

Returning to FIG. 14, after forming the first work function layer, a first second-work function material layer may be formed (S107). FIG. 8 illustrates a corresponding semiconductor structure.

As shown in FIG. 8, a first second-work function material layer 320 is formed on the first work function layer 310 (i.e., the remaining first work function layer 310) and the exposed gate dielectric layer 320. The first second-work function layer 320 may be used to subsequently form a portion of the second work function layer.

To better improve the process compatibility, in one embodiment, the first second-work function material layer 320 and the first work function layer 310 may be made of a same material. Thus, in one embodiment, the first second-work function material layer 320 is made of TiN; and the first second-work function material layer 320 may be formed by an ALD process. Thus, the first second-work function material layer 320 may have a desired step-coverage. The details for forming the first second-work function material layer 320 may be similar to the details for forming the first work function layer 310.

The thickness of the first second-work function material layer 320 may be determined according to the thickness of the first work function layer 310 and the threshold voltages of the subsequently formed first P-type device, the second P-type device, the pull-up transistor, the first N-type device and the pull-down transistor. In one embodiment, the thickness of the first second-work function material layer 320 may be in a range of approximately 10 Å-30 Å.

After forming the first second-work function material layer 320, a barrier layer (not shown) may be formed on the first second-work function material layer 320.

In one embodiment, the barrier layer is made of TaN. An ALD process may be used to form the barrier layer. The barrier layer formed by the ALD process may have a desired step-coverage. In some embodiments, the barrier layer may be made of TiSiN, or TaSiN, etc.; and the barrier layer may be formed by a PVD process, or a CVD process.

On one hand, the material of the barrier material may also be a P-type work function material. The barrier layer may be subsequently used to adjust the threshold voltage of the transistor corresponding to the P-type ultralow threshold voltage region 23. The threshold voltage of the transistor may be mainly affected by the work function layer adjacent to the channel region; and the equivalent work function of TiN may be smaller than the equivalent work function of TaN. Thus, by forming the first work function layer 310 on the portion of the gate dielectric layer 102 on the P-type ultralow threshold voltage region 23 and forming the barrier layer on the first work function layer 310, the threshold voltage of the transistor corresponding to the P-type ultralow threshold voltage region 23 may be adjusted to the targeted value; and a relative small threshold voltage may be obtained.

On the other hand, the barrier layer may be used to prevent the diffusion of the metal ions in the subsequently formed N-type work function layer. The barrier layer may be able to increase the function of the second work function layer for reducing diffusion scale of the metal ions into the first work function layer 310 in the pull-up transistor; and reduce the possibility for the metal ions to diffuse into the work function layer corresponding to the P-type logic region and the pull-up transistor region I. Thus, the adverse effect to electrical properties of the subsequently formed first P-type device, second P-type device and pull-up transistor may be avoided, especially to the pull-up transistor corresponding to the pull-up transistor region I adjacent to the pull-down transistor region II.

The thickness of the barrier layer may be an appropriate value. If the thickness of the barrier layer is too small, the ability for the barrier layer to prevent the diffusion of the metal ions may be undesired. If the thickness of the barrier layer is too large, on one hand, the barrier layer may occupy a relative large portion of the spatial space for the subsequently formed layers. Correspondingly, the equivalent threshold voltages of the subsequently formed layers in different regions may be significantly affected. Thus, in one embodiment, the thickness of the barrier layer may be in a range of approximately 5 Å-15 Å.

Figure 9:
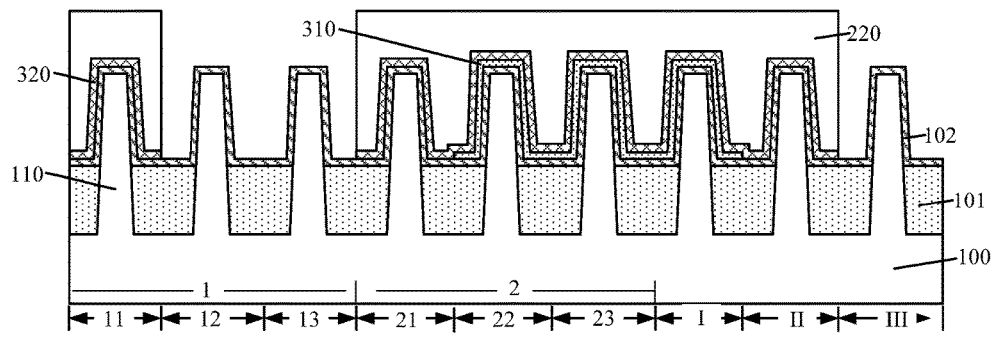

Returning to FIG. 14, after forming the first second-work function material layer, a portion of the first second-work function material layer may be removed (S108). FIG. 9 illustrates a corresponding semiconductor structure.

As shown in FIG. 9, the portion of the first second work function material layer 320 in the second N-type threshold voltage region (not labeled) is removed; and the gate dielectric layer 102 in the second N-type threshold voltage region may be exposed.

For an NMOS region, the threshold voltage of the transistor is correlated with the thickness of the work function layer; and the thicker the work function layer is, the greater the threshold voltage is. Because the base substrate in the first N-type threshold voltage region 11 may be used to form a first N-type device in the base substrate in the second N-type threshold voltage region (not labeled); and the threshold voltage of the first N-type device may be greater than the threshold voltage of the second N-type device, by removing the portion of the first second-work function material layer 320 in the second N-type threshold voltage region, a process base for subsequently forming a relatively thin work function layer on the gate dielectric layer 102 in the second N-type threshold voltage region may be provided.

The process for removing the portion of the first second-work function material layer in the second N-type threshold voltage region may include forming a second pattern layer 220 over the first second-work function material layer 320 in the first N-type threshold voltage region 11, the P-type logic region 2, the pull-up transistor region I, and the pull-down transistor region II; removing the portions of the first second-work function material layer 320 in the second N-type threshold voltage region and the transfer gate transistor region II by a second etching process using the second pattern layer 220 as an etching mask to expose the gate dielectric layer 102; and removing the second pattern layer 220.

In one embodiment, the second pattern layer 220 is made of a photoresist. After the second etching process, the second pattern layer 220 may be removed by a wet etching process, or a plasma ashing process.

In one embodiment, the second etching process is a wet etching process. The first second-work function material layer 320 and the first work function layer 310 may be both made of TiN. Thus, the details of the second etching process may be similar to those of the first etching process.

The barrier layer (not shown) may be formed on the first second-work function material layer 320. Thus, before removing the portion of the first second-work function material layer 320, the barrier layer in the second N-type threshold voltage may be removed. Specifically, before removing the portion of the first second-work function material layer 320, the portions of the barrier layer in the second N-type threshold voltage region and the transfer gate transistor region III may be removed.

In one embodiment, a wet etching process may be used to remove the portions of the first second-work function material layer 320 in the N-type threshold voltage region and the transfer gate transistor region III. In some embodiments, the portions of the first second-work function material layer 320 in the N-type threshold voltage region and the transfer gate transistor region III may be removed by a dry etching process, or a combination of a dry etching process and a wet etching process, etc.

Figure 10:
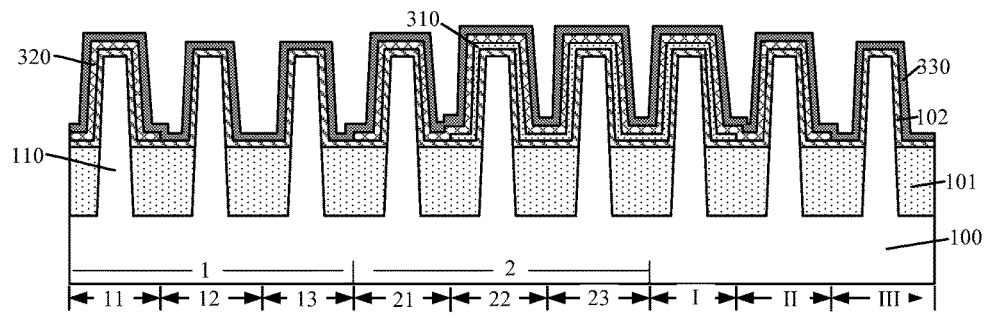

Returning to FIG. 14, after removing the portion of the first second work function layer in the N-type threshold voltage region, a second second-work function material layer may be formed (S109). FIG. 10 illustrates a corresponding semiconductor structure.

As shown in FIG. 10, a second second-work function material layer 330 is formed on the remaining first second-work function material layer 320 and the portion of the gate dielectric layer 102 in the second N-type threshold voltage region (not labeled). The second second-work function material layer 330 and the first second-work function material layer 320 may be used to form a second work function layer.

To increase the process compatibility, the second second-work function material layer 330 and the first work function layer 310 are made of a same material. Thus, in one embodiment, the second second-work function material layer 330 is made of TiN; and the second second-work function material layer 330 is formed by an ALD process. The second second-work function material layer 330 formed by the ALD process may have a desired step-coverage. The details of the process for forming the second second-work function material layer 330 may be similar to those of the process for forming the first work function layer 310.

In one embodiment, during the process for forming the second second-work function material layer 330, the second second-work function material layer 330 may also be formed on the gate dielectric layer 102 in the transfer gate transistor region III.

Because the barrier layer (not shown) may be formed on the first second-work function material layer 330, during the process for forming the second second-work function material layer 330, the second second-work function material layer 330 may be formed on the remaining barrier layer, on the gate dielectric layer 102 in the second N-type threshold voltage region, and on the gate dielectric layer 102 in the transfer gate transistor region II.

In one embodiment, the first second-work function material layer 320, the barrier layer and the second second-work function material layer 330 may form the second work function layer.

The thickness of the second second-work function material layer 330 may be determined according to the thicknesses of the first function layer 310 and the first second-work function material layer 320, and the threshold voltages of the subsequently formed first P-type device, second P-type device, pull-up transistor, first N-type transistor, pull-down transistor and transfer gate transistor. In one embodiment, the thickness of the second second-work function material layer 330 may be in a range of approximately 10 Å-30 Å.

Figure 11:
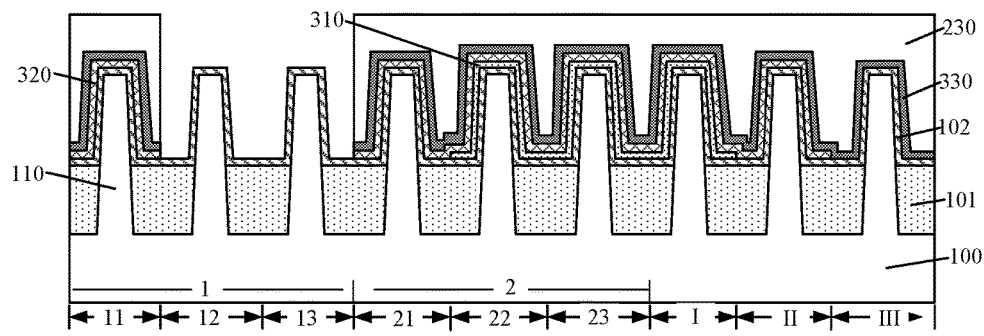

Returning to FIG. 14, after forming the second second-work function material layer, a portion of the second second-work function material layer may be removed (S110). FIG. 11 illustrates a corresponding semiconductor structure.

As shown in FIG. 11, the portion of the second second-work function layer 330 in the second N-type threshold voltage region (not labeled) is removed.

The second work function layer may include the remaining first second-work function material 320 and the remaining second second-work function material 330. Thus, after removing the portion of the second second-work function material layer 330 in the second N-type threshold voltage region, it may be equivalent that the portion of the second work function layer in the second N-type threshold voltage region is removed.

In some embodiments, after forming the first second-work function material layer and the second second-work function material layer, the portion of the second second-work function material layer in the second N-type threshold voltage region and the first second-work function layer in the second N-type threshold voltage region may be sequentially removed.

In one embodiment, during the process for removing the second second-work function material layer 330 in the second N-type threshold voltage region, the second second-work function material layer 330 in the transfer gate transistor region III may be retained.

On one hand, the second second-work function material layer 330 may be used to protect the portion of the gate dielectric layer 102 on the transfer gate transistor region III; and prevent the metal ion in the subsequently formed N-type work function layer from diffusing into the portion of the gate dielectric layer in the transfer gate transistor region III. Thus, the adverse effect on the transfer gate transistor may be avoided. On the other hand, the second second-work function layer may also be a portion of the work function layer corresponding to the transfer gate transistor; and the work function layer may be used to adjust the work function of the subsequently formed transfer gate transistor.

The process for forming the second second-work function material layer 330 may include forming a third pattern layer 230 over the second second-work function material layer 330 in the first N-type threshold voltage region 11, the P-type logic region 2, the pull-up transistor region I, the pull-down transistor region II, and the transfer gate transistor region II; removing the portions of the second second-work function material layer 330 in the N-type ultralow threshold voltage region 13 and the N-type low threshold voltage region 12 by a third etching process using the third pattern layer 230 as an etching mask to expose the gate dielectric layer 102; and removing the second pattern layer 230.

In one embodiment, the second pattern layer 230 is made of photoresist. After performing the third etching process, a wet etching process, or a plasma ashing process may be used to remove the third pattern layer 230.

In one embodiment, the third etching process may be a wet etching process. The second second-work function material layer 330 and the first work function layer 310 may be both made of TiN. Thus, the third etching process may be similar with the first etching process.

Returning to FIG. 14, after forming the second second-work function material layer, an N-type work function layer may be formed (S111). FIG. 12 illustrates a corresponding semiconductor structure.

As shown in FIG. 12, an N-type work function layer 400 is formed on the remaining second work function layer (not labeled) and the exposed gate dielectric layer 102 in the second N-type threshold voltage region (not labeled).

In one embodiment, the N-type work function layer 400 may also be formed on the second second-work function material layer 330. The N-type work function layer 400 may be a portion of the work function layer corresponding to the N-type logic region 1, the pull-down transistor region II, the transfer gate transistor region III; and may be used to adjust the threshold voltages of the subsequently formed first N-type device, second N-type device, pull-down transistor and transfer gate transistor. The N-type work function layer 400 may also be used to adjust the threshold voltages of the transistors corresponding to the P-type logic region 2 and the pull-up transistor region I.

The N-type work function layer 400 may be made of an N-type work function material. The work function of the N-type work function material may be in a range of approximately 3.9 eV-4.5 eV, such as 4 eV, 4.1 eV, or 4.3 eV, etc. The N-type work function layer 400 may be made of one or more of TiAl, TiAlC, TaAlN, TiAlN, TaCN, and AN, etc. Various processes may be used to form the N-type work function layer 400, such as a CVD process, a PVD process, or an ALD process, etc.

In one embodiment, the N-type work function layer 400 is made of TiAlC; and an ALD process may be used to form the N-type work function layer 400. The N-type work function layer 400 formed by the ALD process may have a desired step-coverage.

The thickness of the N-type work function layer 400 may be determined according to the thicknesses of the first work function layer 310, the first second-work function material layer 320 and the second second-work function material layer 330, and the threshold voltages of the first P-type device, the second P-type device, the pull-up transistor, the first N-type device, the second N-type device, the pull-down transistor and the transfer gate transistor. In one embodiment, the thickness of the N-type work function layer 400 is in a range of approximately 20 Å-80 Å.

Thus, in one embodiment, the portion of the second work function layer (not labeled) and the portion of the N-type work function layer 400 in the N-type threshold voltage region 11 may be used to adjust the threshold voltage of the first N-type device. The portion of the N-type work function layer 400 in the second N-type threshold voltage region (not labeled) may be used to adjust the threshold voltage of the second N-type device. The portion of the second work function layer and the portion of the N-type work function layer in the pull-down transistor region II may be used to adjust the threshold voltage of the pull-down transistor. The portion of the second second-work function material layer 330 and the portion of the N-type work function layer 400 in the transfer gate transistor region III may be used to adjust the threshold voltage of the transfer gate transistor. The portion of the first work function layer 310, the portion of the second work function layer and the portion of the N-type work function layer 400 in the first P-type threshold voltage region (not labeled) may be used to adjust the threshold voltage of the first P-type device. The portion of the first work function layer 310, the portion of the second work function layer and the portion of the N-type work function layer in the pull-up transistor region I may be used to adjust the threshold voltage of the pull-up transistor.

Returning to FIG. 14, after forming the N-type work function layer, a gate electrode layer may be formed (S112). FIG. 13 illustrates a corresponding semiconductor structure.

As shown in FIG. 13, a gate electrode layer 500 is formed on the N-type work function layer 400.

In one embodiment, the gate electrode layer 500 may also be formed on the portion of the N-type work function layer 400 in the transfer gate transistor region III.

In one embodiment, the gate electrode layer 500 may be across the first N-type threshold voltage region 11, the second N-type threshold voltage region (not labeled), the first P-type threshold voltage region (not labeled), the second P-type threshold voltage region 21, the pull-up transistor region I, the pull-down transistor region II, and the transfer gate transistor region III. In some embodiments, the gate electrode layer 500 in the first N-type threshold voltage region 11, the second N-type threshold voltage region (not labeled), the first P-type threshold voltage region (not labeled), the second P-type threshold voltage region 21, the pull-up transistor region I, the pull-down transistor region II and the transfer gate transistor region III may be separated; and may be independent in each region.

In one embodiment, the gate electrode layer 500 may be made of one or more of Al, Cu, Ag, Au, Pt, Ni, Ti, and W, etc.

The process for forming the gate electrode layer 500 may include forming a gate electrode film on the N-type work function material layer 400 in the first N-type threshold voltage region 11, the second N-type threshold voltage region (not labeled), the first P-type threshold voltage region (not labeled), the second P-type threshold voltage region 21, the pull-up transistor region I, the pull-down transistor region II, and the transfer gate transistor region III. The top surface of the gate electrode film may be above the top surface of the interlayer dielectric layer (not shown). Then, the portion of the gate electrode film above the interlayer dielectric layer may be removed by a polishing process; and the gate electrode layer 500 may be formed.

In one embodiment, after forming the second work function layer (not labeled) on the remaining first work function layer 310 (as shown in FIG. 11) and the exposed portion of the gate dielectric layer 102 (as shown in FIG. 11), the second work function layer in the pull-down transistor region II may be retained. Thus, when the N-type work function layer 400 is subsequently formed, the N-type work function layer 400 may be formed on the second work function layer 400 in the pull-down transistor region II. Comparing with that only the N-type work function is formed in the pull-down transistor region, the second work function layer in the disclosed methods may cover the side surface of the boundary region (region "B" illustrated in FIG. 13) between the pull-up transistor region I and the pull-down transistor region II; and may also cover the top surface of the first work function layer 310. The second work function may increase the path for the metal ions in the N-type work function layer 400 to diffuse into the first work function layer 310 in the pull-up transistor region I; and the diffusion scale may be gradually reduced. Thus, the effect of the metal ions on the first work function layer 310 in the pull-up transistor region I may be reduced. Further, the second work function layer at the boundary region between the pull-up transistor region I and the pull-down transistor region II may not be affected by the etching process, etc., the quality of the second work function layer may be improved as desired.

Further, the electrical properties of the pull-up transistor may be mainly affected by the first work function layer adjacent to the channel region. On one hand, the adverse effect on the pull-up transistor may be avoided. On the other hand, the non-consistency of the diffusion scales of the metal ions in different devices may be avoided; and the mismatch issue between the pull-up transistor and the pull-down transistor in the SRAM may be substantially solved. Accordingly, the electrical properties of the SRAM may be controlled; and the entire performance of the semiconductor device may be improved.

Correspondingly, the present disclosure provides a semiconductor structure. The semiconductor is illustrated in FIG. 13.

As shown in FIG. 13, the semiconductor structure includes a base substrate. The base substrate may include an N-type logic regions 1, a P-type logic region 2, and a pull-up transistor region I and a pull-down transistor region II adjacent to the pull-up transistor region I. The N-type logic region 1 may include a first N-type threshold voltage region 11 used for forming a first N-type device, and a second N-type threshold voltage region (not labeled) used for forming a second N-type device. The threshold voltage of the first N-type device may be greater than the threshold voltage of the second N-type device. The P-type logic region 2 may include a first P-type threshold voltage region (not shown) used for forming a first P-type device, and a second P-type threshold voltage region 21 used for forming a second P-type device. The threshold voltage of the first P-type device may be smaller than the threshold voltage of the second P-type device.

Further, the semiconductor structure may include a gate dielectric layer 102 on the portions of the base substrate in the N-type logic region 1, the P-type logic region 2, the pull-up transistor region I and the pull-down transistor region II.

Further, the semiconductor structure may also include a first work function layer 310 on the portions of the gate dielectric layer 102 in the first P-type threshold voltage region and the pull-up transistor region I.

Further, the semiconductor structure may also include a second work function layer (not labeled) on the portion of the gate dielectric layer 102 in the first N-type threshold voltage region 11, the portion of the gate dielectric layer 102 in the second P-type threshold voltage region 21 and the portions of the first work function layer 310 in the first P-type threshold voltage region and the pull-up transistor region I.

Further, the semiconductor structure may also include an N-type work function layer 400 on the second work function layer and the portion of the gate dielectric layer 102 in the N-type threshold voltage region.

Further, the semiconductor structure may also include a gate electrode layer 500 on the N-type work function layer 400.

In one embodiment, the semiconductor structure includes logic devices and SRAM devices. Thus, the base substrate in the N-type logic region 1 may have N-type logic devices; the base substrate in the P-type logic region 2 may have P-type logic devices; the base substrate in the pull-up transistor region I may have a pull-up transistor; and the base substrate in the pull-down transistor region II may have a pull-down transistor. The pull-up transistor region I may be a PMOS region; and the pull-down transistor region II may be an NMOS region.

In one embodiment, the base substrate may also include a transfer gate transistor region III. The base substrate in the transfer gate transistor region III may have a transfer gate transistor. The transfer gate transistor region III may be an NMOS region. The pull-up transistor region I, the pull-down transistor region II and the transfer gate transistor region III may be memory regions.

The N-type logic region 1 may include a plurality of N-type threshold voltage regions. Specifically, the first N-type threshold voltage region 11 may be an N-type standard threshold voltage region (SVT, standard VT) 11; the second N-type threshold voltage region may include an N-type ultralow threshold voltage region (ULVT, ultra-low VT) 13, and an N-type low threshold voltage region (LVT, low VT) 12.

The threshold voltages of the N-type logic devices formed in the N-type logic region 1 can be sorted from low to high for the threshold voltage of the N-type ULVT region 13, the threshold voltage of the N-type LVT region 12 and the first N-type SVT region 11. The N-type logic region 1 may also include an N-type high threshold voltage (HVT, High VT) region (not shown) and an N-type input/output (TO) device region (not shown).

The P-type logic region 2 may include a plurality of P-type threshold regions. Specifically, the first P-type threshold voltage region may include a P-type ultralow threshold voltage region 23, and a P-type low threshold voltage region 22. The second P-type threshold voltage region 21 may be a P-type standard threshold voltage region 21.

The threshold voltages of the P-type logic devices formed in the P-type logic region 2 can be sorted from low to high for the threshold voltage of the P-type ultralow threshold voltage region 23, the threshold voltage of the P-type low threshold voltage region 22, and the second P-type standard threshold voltage region 21. The P-type logic region 2 may also include a P-type logic high threshold voltage region (not shown) and a P-type input/output (TO) device region (not shown).

In one embodiment, the semiconductor structure is a fin field-effect transistor (FinFET) structure. Thus, the base substrate may include a semiconductor substrate 100 and a plurality of fins 110 on the semiconductor substrate 100. Correspondingly, the gate dielectric layer 102 may be across the plurality of fins 110 by covering portions of the side and top surfaces of the fins 110.

In some embodiments, the semiconductor structure may be planar transistors. Correspondingly, the base substrate may be a planar substrate. The planar substrate may be a silicon substrate, a germanium substrate, a silicon germanium substrate, a silicon carbide substrate, a silicon on insulator (SOI) substrate, a germanium on insulator (GOI) substrate, a glass substrate, or a Group III-V compound substrate (such as gallium nitride substrate, or gallium arsenide substrate, etc.), etc.

In one embodiment, the semiconductor substrate 100 is made of silicon. In some embodiments, the semiconductor substrate 100 may be a germanium substrate, a silicon germanium substrate, a silicon carbide substrate, a silicon on insulator (SOI) substrate, a germanium on insulator (GOI) substrate, a glass substrate, or a Group III-V compound substrate (such as gallium nitride substrate, or gallium arsenide substrate, etc.), etc.

In one embodiment, the fins 110 and the semiconductor substrate 100 are made of a same material. The fins 110 and the semiconductor substrate 100 may be both made of silicon. In some other embodiments, the fins may also be made of germanium, silicon germanium, silicon carbide, gallium arsenide, or gallium indium, etc.

Further, the semiconductor structure may also include an isolation structure 101 on the surface of the semiconductor substrate 100 among the fins 110. The isolation structure 101 may cover the side surfaces of the fins 110; and the top surface of the isolation structure 101 may be below the tops of the fins 110.

Further, the semiconductor structure may also include N-type well regions (not shown) in the base substrate in the P-type logic region 2 and the pull-up transistor region I, and P-type well regions (not shown) in the base substrate in the N-type logic region 1, the pull-down transistor region II and the transfer gate transistor region III.

In one embodiment, the gate dielectric layer 102 may also be on the portion of the base substrate in the transfer gate transistor region III.

In one embodiment, the gate dielectric layer 102 may include an interface layer (IL, not labeled) and a high-K gate dielectric layer (not labeled). The gate dielectric layer 102 may be across the fins 110 by covering portions of the side and top surfaces of the fins 110.

The interface layer may provide a desired interface base for forming the high-K gate dielectric layer. Thus, the quality of the high-K gate dielectric layer may be improved; and interfacial density between the high-K gate dielectric layer and the fins 110 may be reduced; and the adverse effect caused by the direct contact between the high-K dielectric layer and the fins 110 may be avoided. The interface layer may be made of silicon oxide, or silicon oxynitride, etc.

The high-K gate dielectric material may refer to the material having a relative dielectric constant greater than that of silicon oxide. In one embodiment, the high-K dielectric layer is made of $HfO_2$. In some embodiments, the high-K gate dielectric material may be made of HfSiO, HfSiON, HfTaO, HfSiO, HfZrO, $ZrO_2$ and $Al_2O_3$, etc.

In one embodiment, the second work function layer (not labeled) may be a multiple-layer stacked structure. The second work function layer may include a first second-work function material layer 320 and a second second-work function material layer 330 on the first second-work function material layer 320. The first second-work function material layer 320 may be on the portion of the gate dielectric layer 102 in the first N-type threshold voltage region 1, the portion of the gate dielectric layer 102 in the second threshold voltage region 21 and the portion of the first work function layer 310 in the first P-type threshold voltage region and the portion of the first work function layer 310 in the pull-up transistor region I.

The second second-work function material layer 330 may also be on the portion of the gate dielectric layer 102 in the transfer gate transistor region III. On one hand, the second second-work function material layer 330 may be used to protect the portion of the gate dielectric layer 102 in the transfer gate transistor region III; and prevent the metal ions in the subsequently formed N-type work function layer from diffusing into the portion of the gate dielectric layer 102 in the transfer gate transistor region III. Thus, the adverse effect to the transfer gate transistor may be avoided. On the other hand, the second second-work function material layer 330 may also be a portion of the work function layer corresponding to the subsequently formed transfer gate transistor; and the work function layer may be used to adjust the work function of the transfer gate transistor. Correspondingly, the N-type work function layer 400 may also be on the portion of the second second-work function material layer 330 in the transfer gate transistor region III.

The portions of the second work function layer (not labeled) and the N-type work function layer 400 in the first N-type threshold voltage region 11 may form the work function layer of the first N-type device; and may be used to adjust the threshold voltage of the first N-type device. The portions of the gate dielectric layer 102, the second work function layer, the N-type work function layer 400 and the gate electrode layer 500 in the first N-type threshold voltage region III may form the gate structure in the first N-type threshold voltage region 11.

The portion of the N-type work function layer 400 in the second N-type threshold voltage region (not labeled) may form the work function layer of the second N-type device; and may be used to adjust the threshold voltage of the second N-type device. The portions of the gate dielectric layer 102, the N-type work function layer 400 and the gate electrode layer 500 in the second N-type threshold voltage region may form the gate structure in the second N-type threshold voltage region.

The portions of the second work function layer and the N-type work function layer 400 in the pull-down transistor region II may form the work function layer of the pull-down transistor; and may be used to adjust the threshold voltage of the pull-down transistor. The portions of the gate dielectric layer 102, the second work function layer, the N-type work function layer 400 and the gate electrode layer 500 in the pull-down transistor region II may form the gate structure in the pull-down transistor region II.

The portions of the second second-work function material layer 330 and the N-type work function layer 400 in the transfer gate transistor region III may form the work function layer of the transfer gate transistor; and may be used to adjust the threshold voltage of the transfer gate transistor. The portions of the gate dielectric layer 102, the second second-work function layer 330, the N-type work function layer 400 and the gate electrode layer 500 in the transfer gate transistor region III may form the gate structure in the transfer gate transistor region III.

The portions of the second work function layer and the N-type work function layer 400 in the second P-type threshold voltage region 21 may form the work function layer of the second P-type device; and may be used to adjust the threshold voltage of the second P-type device. The portions of the gate dielectric layer 102, the second work function layer, the N-type work function layer 400 and the gate electrode layer 500 in the second P-type threshold voltage region 21 may form the gate structure in the P-type threshold voltage region 21.

The portions of the first work function layer 310, the second work function layer and the N-type work function layer 400 in the first P-type threshold voltage region (not labeled) may form the work function layer of the first P-type device; and may be used to adjust the threshold voltage of the first P-type device. The portions of the gate dielectric layer 102, the first work function layer 310, the second work function layer, the N-type work function layer 400 and the gate electrode layer 500 in the first P-type threshold voltage region (not labeled) may form the gate structure in the first P-type threshold voltage region (not labeled).

The portions of the first work function layer 310, the second work function layer and the N-type work function layer 400 in the pull-up transistor region I may form the work function layer of the pull-up transistor; and may be used to adjust the threshold voltage of the pull-up transistor. The portions of the gate dielectric layer 102, the first work function layer 310, the second work function layer, the N-type work function layer 400 and the gate electrode layer 500 in the pull-up transistor region I may form the gate structure in the pull-up transistor region I.

The first work function layer 310 may be made of a P-type work function material. The work function of the P-type work function material may be in a range of 5.1 eV-5.5 eV, such as 5.2 eV, 5.3 eV, or 5.4 eV, etc. The first work function layer 310 may be made of one or more of Ta, TiN, TaN, TaSiN, and TiSiN, etc. In one embodiment, the first work function layer 310 is made of TiN.

The thickness of the first work function layer 310 may be determined according to the threshold voltages of the transistors corresponding to the P-type ultralow threshold voltage region 23 and the P-type low threshold voltage region 22. In one embodiment, the thickness of the first work function layer 310 may be in a range of approximately 15 Å-35 Å.

To better improve the process compatibility, in one embodiment, the first second-work function material layer 320 and the second second-work function material layer 330 may be made of a same material with that of the first work function layer 310. Thus, in one embodiment, the first second-work function material layer 320 and the second second-work function material layer 330 may be both made of TiN.

The thickness of the first second-work function material layer 320 may be determined according to the thicknesses of the first work function layer 310, and the threshold voltages of the first P-type device, the second P-type device, the pull-up transistor, the first N-type device, and the pull-down transistor. In one embodiment, the thickness of the first second-work function layer 320 is in a range of approximately 10 Å-30 Å.

The thickness of the second second-work function material layer 330 may be determined according to the thicknesses of the first work function layer 310 and the first second-work function material layer 320, and the threshold voltages of the first P-type device, the second P-type device, the pull-up transistor, the first N-type device, the pull-down transistor and the transfer gate transistor. In one embodiment, the thickness of the second second-work function material layer 330 is in a range of approximately 10 Å-30 Å.

Further, the semiconductor structure may also include a barrier layer (not shown) between the first work function layer 310 and the first second-work function material layer 320.

In one embodiment, the barrier layer is made of TaN. In some embodiments, the barrier layer may be made of TiSiN, or TaSiN, etc.

On one hand, the material of the barrier material may also be a P-type work function material. The barrier layer may be subsequently used to adjust the threshold voltage of the transistor corresponding to the P-type ultralow threshold voltage region 23. The threshold voltage of the transistor may be mainly affected by the work function layer adjacent to the channel region; and the equivalent work function of TiN may be smaller than the equivalent work function of TaN. Thus, by forming the first work function layer 310 on the portion of the gate dielectric layer 102 in the P-type ultralow threshold voltage region 23 and forming the barrier layer on the first work function layer 310, the threshold voltage of the transistor corresponding to the P-type ultralow threshold voltage region 23 may be adjusted to the targeted value; and a relative small threshold voltage may be obtained.

On the other hand, the barrier layer may be used to prevent the diffusion of the metal ions in the subsequently formed N-type work function layer. The barrier layer may be able to increase the function of the second work function layer for reducing diffusion scale of the metal ions into the first work function layer 310 in the pull-up transistor; and reduce the possibility for the metal ions to diffuse into the work function layer corresponding to the P-type logic region and the pull-up transistor region I. Thus, the adverse effect to electrical properties of the subsequently formed first P-type device, second P-type device and pull-up transistor may be avoided, especially to the pull-transistor corresponding to the pull-up transistor region I adjacent to the pull-down transistor region II.

The thickness of the barrier layer may be an appropriate value. If the thickness of the barrier layer is too small, the ability for the barrier layer to prevent the diffusion of the metal ions may be undesired. If the thickness of the barrier layer is too large, on one hand, the barrier layer may occupy a relative large portion of the spatial space for the subsequently formed layers. Correspondingly, the equivalent threshold voltages of the subsequently formed layers in different regions may be significantly affected. Thus, in one embodiment, the thickness of the barrier layer may be in a range of approximately 5 Å-15 Å.

The N-type work function layer 400 may be made of an N-type work function material. The work function of the N-type work function material may be in a range of approximately 3.9 eV-4.5 eV, such as 4 eV, 4.1 eV, or 4.3 eV, etc. The N-type work function layer 400 may be made of one or more of TiAl, TiAlC, TaAlN, TiAlN, TaCN and AlN, etc. In one embodiment, the N-type work function layer 400 is made of TiAlC.

The thickness of the N-type work function layer 400 may be determined according to the thicknesses of the first work function layer 310, the first second-work function material layer 320 and the second second-work function material layer 330, and the threshold voltages of the first N-type device, the second N-type device, the pull-down transistor and the transfer gate transistor. The N-type work function layer 400 may be able to affect the threshold voltages of the first P-type device, the second P-type device and the pull-up transistor. In one embodiment, the thickness of the N-type work function layer is in a range of approximately 20 Å-80 Å.

Thus, in one embodiment, the portion of the second work function layer (not labeled) and the portion of the N-type work function layer 400 in the N-type threshold voltage region 11 may be used to adjust the threshold voltage of the first N-type device. The portion of the N-type work function layer 400 in the second N-type threshold voltage region (not labeled) may be used to adjust the threshold voltage of the second N-type device. The portion of the second work function layer and the portion of the N-type work function layer in the pull-down transistor region II may be used to adjust the threshold voltage of the pull-down transistor. The portion of the second second-work function material layer 330 and the portion of the N-type work function layer 400 in the transfer gate transistor region III may be used to adjust the threshold voltage of the transfer gate transistor. The portion of the first work function layer 310, the portion of the second work function layer and the portion of the N-type work function layer 400 in the first P-type threshold voltage region (not labeled) may be used to adjust the threshold voltage of the first P-type device. The portion of the first work function layer 310, the portion of the second work function layer and the portion of the N-type work function layer in the pull-up transistor region I may be used to adjust the threshold voltage of the pull-up transistor.

In one embodiment, the gate electrode layer 500 may also be formed on the portion of the N-type work function layer 400 in the transfer gate transistor region III.

In one embodiment, the gate electrode layer 500 may be across the first N-type threshold voltage region 11, the second N-type threshold voltage region (not labeled), the first P-type threshold voltage region (not labeled), the second P-type threshold voltage region 21, the pull-up transistor region I, the pull-down transistor region II, and the transfer gate transistor region III. In some embodiments, the gate electrode layer 500 in the first N-type threshold voltage region 11, the second N-type threshold voltage region (not labeled), the first P-type threshold voltage region (not labeled), the second P-type threshold voltage region 21, the pull-up transistor region I, the pull-down transistor region II, and the transfer gate transistor region III may be separated; and may be independent in each region.

In one embodiment, the gate electrode layer 500 may be made of one or more of Al, Cu, Ag, Au, Pt, Ni, Ti, and W, etc.

In one embodiment, the second work function layer of the semiconductor structure may be not only on the first work function layer 310, but also on the portion of the gate dielectric layer 102 in the pull-down transistor region II. That is, the second work function may be on the side surface of the first work function layer 310 at the boundary region (region "B" illustrated in FIG. 13) between the pull-up transistor region I and the pull-down transistor region II; and may also cover the top surface of the first work function layer 310. Because the N-type work function layer 400 may be on the second work function layer, comparing with the semiconductor structure that only has the N-type work function layer, the second work function layer in the disclosed embodiments may increase the path for the metal ions in the N-type work function layer 400 to diffuse into the first work function layer 310 in the pull-up transistor region I; and the diffusion scale may be gradually reduced. Thus, the effect of the metal ions on the first work function layer 310 in the pull-up transistor region I may be reduced.

Further, the electrical properties of the pull-up transistor may be mainly affected by the first work function layer adjacent to the channel region. On one hand, the adverse effect to the pull-up transistor may be avoided. On the other hand, the non-consistency of the diffusion scales of the metal ions in different devices may be avoided; and the mismatch issue between the pull-up transistor and the pull-down transistor in the SRAM may be substantially solved. Accordingly, the electrical properties of the SRAM may be controlled; and the overall performance of the semiconductor device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    providing a base substrate having an N-type logic region including a first N-type threshold voltage region and a second N-type threshold voltage region, a P-type logic region including a first P-type threshold voltage region and a second P-type threshold voltage region, a pull-up transistor region and a pull-down transistor region adjacent to the pull-up transistor region;
    forming a gate dielectric layer on portions of the base substrate in the N-type logic region, the P-type logic region, the pull-up transistor region and the pull-down transistor region;
    forming a first work function layer on the gate dielectric layer;
    removing portions of the first work function layer in the N-type logic region, the pull-up transistor region and the second P-type threshold voltage region;
    forming a second work function layer on remaining first work function layer and exposed portions of the gate dielectric layer;
    removing a portion of the second work function layer in the second N-type threshold voltage region;
    forming an N-type work function layer on remaining second work function layer and exposed portions of the gate dielectric layer in the second N-type threshold voltage region; and
    forming a gate electrode layer on the N-type work function layer, wherein forming the second work function layer on the remaining first work function layer and the exposed portion of the gate dielectric layer and removing the portion of the second work function layer in the second N-type threshold voltage region comprise:
        forming a first second-work function material layer on the remaining first work function layer and the exposed portions of the gate dielectric layer;
        removing a portion of the first second-work function material layer in the second N-type threshold voltage region to expose a portion of the gate electrode layer in the N-type threshold voltage region;
        forming a second second-work function material layer on remaining first second-work function material layer and a portion of the gate dielectric layer in the second N-type threshold voltage region, the remaining first second-work function material layer and the second second-work function material layer forming the second work function layer; and removing a portion of the second second-work function material layer in the second N-type threshold voltage region.

2. The method according to claim 1, wherein:
    the first work function layer, the first second-work function material layer and the second second-work function material layer are made of TiN;
    a thickness of the first work function layer is in a range of approximately 15 Å-35 Å;
    a thickness of the first second-work function material layer is in a range of approximately 10 Å-30 Å; and
    a thickness of the second second-work function material layer is in a range of approximately 10 Å-30 Å.

3. The method according to claim 1, after forming the first second-work function material layer on the remaining first work function layer and the exposed portions of the gate dielectric layer and before removing the first second-work function material layer in the N-type threshold voltage, further comprising:
    forming a barrier layer on the first second-work function material layer; and
    removing a portion of the barrier layer in the second N-type threshold voltage region,
    wherein:
        the second second-work function material is formed on remaining barrier layer; and
        the first second-work function material layer, the barrier layer and the second second-work function material layer are used to form the second work function layer.

4. The method according to claim 3, wherein:
    the barrier layer is made of one of TaN, TiSiN, and TaSiN.

5. The method according to claim 3, wherein:
    a thickness of the barrier layer is in range of approximately 5 Å-15 Å.

6. The method according to claim 1, wherein the base structure has a transfer gate transistor region, wherein:
    the gate dielectric layer is also formed on a portion of the base substrate in the transfer gate transistor region during a process for forming gate dielectric layer on portions of the base substrate in the N-type logic region, the P-type logic region, the pull-up transistor region and the pull-down transistor region;
    the first work function layer is also formed on a portion of the gate dielectric layer in the transfer gate transistor region during a process for forming the first work function layer on the gate dielectric layer;
    a portion of the first work function layer in the transfer gate transistor region is also removed during a process for removing portions of the first work function layer in the N-type logic region, the pull-down transistor region and the second P-type threshold voltage region;
    the second second-work function material layer is also formed on a portion of the gate dielectric layer in the transfer gate transistor region during a process for forming the second second-work function material layer on remaining first work function layer and the portion of the gate dielectric layer in the second N-type threshold voltage region; and
    the N-type work function layer is also formed on a portion of the second second-work function material layer in the transfer gate transistor region during the process for forming the N-type work function layer on remaining second work function layer and a portion of the gate dielectric layer in the second N-type threshold voltage region.

7. The method according to claim 1, wherein:
the N-type work function layer is made of TiAlC; and
the thickness of the N-type work function layer is in a range of approximately 20 Å-80 Å.

8. The method according to claim 1, after forming the gate dielectric layer on the portions of the base substrate in the N-type logic region, the P-type logic region, the pull-up transistor region and the pull-down transistor region and before forming the first work function layer, further comprising:
performing a thermal annealing process on the base substrate.

9. The method according to claim 1, wherein:
the base substrate is used to form fin field-effect transistors;
the base substrate includes a semiconductor substrate and a plurality of fins on the semiconductor substrate; and
the dielectric layer is across the plurality of fins by covering side and top surfaces of the plurality of fins.

* * * * *